United States Patent [19]

Fujiwara et al.

[11] Patent Number: 4,864,348

[45] Date of Patent: Sep. 5, 1989

[54] STRUCTURE FOR INSTALLING FLEXIBLE PRINTED CIRCUIT BOARD

[75] Inventors: Yutaka Fujiwara, Kanagawa; Masatoshi Nagano, Tokyo, both of Japan

[73] Assignee: Canon Kabushiki Kaisha, Tokyo, Japan

[21] Appl. No.: 239,263

[22] Filed: Sep. 1, 1988

[30] Foreign Application Priority Data

Sep. 3, 1987 [JP] Japan ................................ 62-220755
Sep. 8, 1987 [JP] Japan ................................ 62-224256
Sep. 8, 1987 [JP] Japan ................................ 62-224258

[51] Int. Cl.$^4$ ............................................. G03B 7/00
[52] U.S. Cl. .................................... 354/485; 354/286; 354/295; 361/398; 174/69
[58] Field of Search ................... 354/485, 286, 295; 361/398; 174/69

[56] References Cited

U.S. PATENT DOCUMENTS

| | | | |
|---|---|---|---|
| 3,300,572 | 1/1967 | Dahlgren et al. | 174/69 |
| 4,196,997 | 4/1980 | Ohmori et al. | 354/286 |
| 4,547,053 | 10/1985 | Tobler | 354/295 |
| 4,596,454 | 6/1986 | Kawai et al. | 354/286 |
| 4,789,875 | 12/1988 | Wakabayashi et al. | 354/485 |

Primary Examiner—Russell E. Adams
Attorney, Agent, or Firm—Fitzpatrick, Cella, Harper & Scinto

[57] ABSTRACT

A structure is provided for installing a flexible printed circuit board retained in a state in which a plurality of U-turn portions are formed in members moving relatively to and parallel with each other. At least two of the plurality of U-turn portions are arranged on a straight line such that at least parts of the moving paths of the plurality of U-turn portions are overlapped with each other. Positions at which the members are retained are determined such that the plurality of U-turn portions are assembled together at a particular timing in the relatively moving strokes of the members.

22 Claims, 13 Drawing Sheets

STRUCTURE FOR INSTALLING FLEXIBLE PRINTED CIRCUIT BOARD

BACKGROUND OF THE INVENTION

1. Field of the Invention

This invention relates to a structure for installing a flexible printed circuit board for allowing a flexible printed circuit board to be installed between members moving relatively to each other.

2. Description of the Related Art

Flexible printed circuit boards (hereinafter abbreviated as FPC boards) are indispensable electric parts in performing an electrical installation on compact equipment, and the field of its applications tends to expand with progress in semiconductor technology.

When an FPC board is installed between members moving relatively to each other, how to deal with a slackened portion occurring in the FPC board when the distance between the members becomes small is an important problem.

Conventionally, as methods of installing an FPC board between members moving relatively to each other, various methods are known (e.g. U.S. Pat. No. 4,596,454). For example, there is a method in which a belt-shaped FPC board is fixed to two members moving relatively to each other, a U-turn portion which moves in correspondence with variations in the relative distance between the relatively moving members is formed between fixing points, and the slackened portion is absorbed by the U-turn portion when the relative distance between the members becomes small. In the structure for installing the FPC board in accordance with this method, there is an advantage in that a large space for the slackened portion of the FPC board between the members is not required since the slackened portion is absorbed as the U-turn portion moves in parallel with the direction of the relative movement of the members.

However, in an apparatus in which a multiplicity of FPC boards having the above-described construction needs to be installed, a multiplicity of spaces for the movement of the U-turn portions of the FPC boards are required, so that it is necessary to form substantial spaces in the vicinity of the relatively moving members and between the relatively moving members. Hence, there has been the drawback that the apparatus becomes large in size as a result.

SUMMARY OF THE INVENTION

Accordingly, an object of the present invention is to provide a structure for installing a flexible printed circuit board which is capable of overcoming the above-described drawbacks of the conventional art.

According to one aspect of the invention, there is provided a structure for installing a plurality of flexible printed circuit boards each having a U-turn portion, wherein the U-turn portions overlap with each other to make required spaces in the FPC boards small.

According to another aspect of the invention, there is provided a structure for installing flexible printed circuit boards in which a plurality of belt-shaped FPC boards each having a U-shaped portion are installed in an apparatus having an annular space extending axially, wherein the U-turn portions of the plurality of FPC boards are superposed on each other so as to enhance the rate of utilization of the annular space.

According to still another aspect of the invention, there is provided a structure for installing a flexible printed circuit board for allowing FPC boards each having a U-turn portion to be installed on three or more members moving relative to and parallel with each other, wherein at least two or more of the U-turn portions are assembled at a particular timing of the relatively moving stroke of the members.

DETAILED DESCRIPTION OF THE PREFERRED EMBODIMENTS

Figure 1:
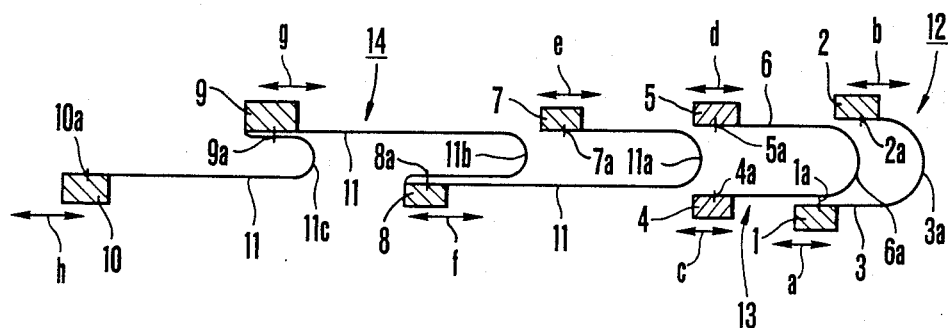
FIG. 1 is a schematic diagram illustrating a first state in which a structure for installing an flexible printed circuit (FPC) board in accordance with a first embodiment of the present invention is adopted.
Figure 2:
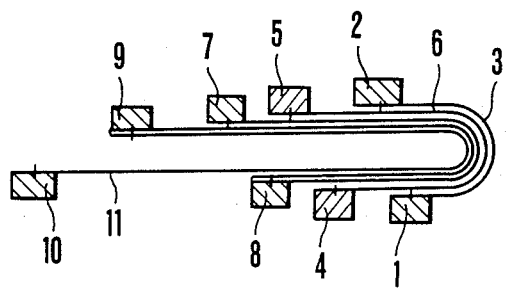
FIG. 2 is a schematic diagram illustrating a second state of the apparatus shown in FIG. 1.
Figure 3:
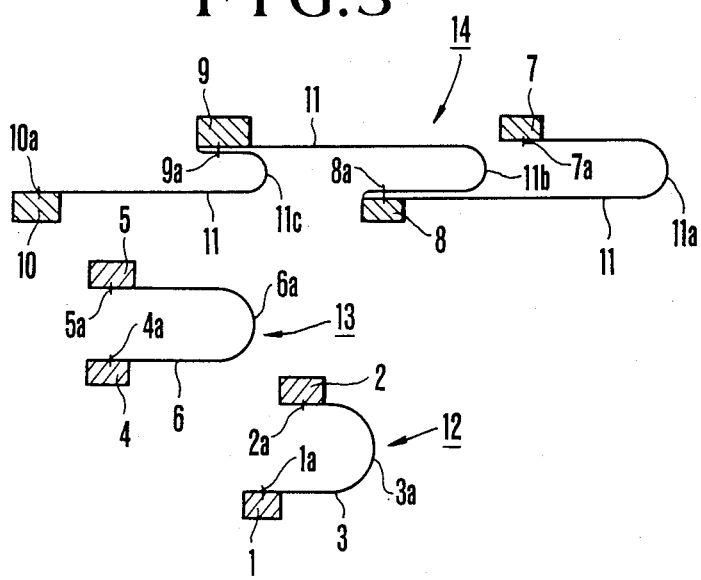
FIG. 3 is a schematic diagram illustrating the first state of the apparatus in which the structure of the first embodiment is not adopted.

Referring now to FIGS. 1 and 2, a description will be given of a first embodiment of the present invention. FIG. 3 is shown to explain the features of the first embodiment, illustrating an apparatus to which an arrangement of the first embodiment is not applied.

FIGS. 1 and 2 illustrate a case in which a structure for installing an FPC board according to the first embodiment of the present invention is applied to an apparatus having at least more than one relatively moving mechanism which comprises at least two members that move relatively with respect to and parallel with each other. FIG. 1 is a schematic diagram illustrating a state in which U-turn portions of FPC boards of the relatively moving mechanisms are separated from each other, while FIG. 2 is a schematic diagram illustrating a state in which the U-turn portions of the FPC boards are gathered together.

In FIG. 1, a structure for installing an FPC board in accordance with this embodiment comprises the following components: relatively moving members 1 and 2 adapted to move relative to and parallel with each other in the directions of the arrows a and b; an FPC board 3 which is fixed to (or retained at) the two members 1 and 2 at fixing points 1a and 2a and in which a U-turn portion 3a is formed between the fixing points; relatively moving members 4 and 5 which move relative to and parallel with each other in the directions of the arrows c and d; an FPC board 6 which is fixed to the two members 4 and 5 at fixing points 4a and 5a and in which a U-turn portion 6a is formed between the two fixing points; relatively moving members 7 to 10 which move relative to and parallel with each other in the directions of the arrows e to h; and an FPC board 11 which is fixed to the members 7 to 10 at fixing points 7a to 10a and in which U-turn portions 11a to 11c are respectively formed between the fixing points. The members 1 and 2 constitute a first relatively moving mechanism 12; the members 4 and 5 constitute a second relatively moving mechanism 13; and the members 7 to 10 constitute a third relatively moving mechanism 14.

In the structure for installing an FPC board in accordance with this embodiment, as shown in FIG. 1, the U-turn portions 3a, 6a, 11a, 11b and 11c of the plurality of FPC boards installed on the plurality of relatively moving mechanisms are disposed in such a manner as to be arranged along a straight line, and the respective FPC boards are installed on the relatively moving members of the relatively moving mechanisms in such a manner that at least parts of the moving paths of the U-turn portions overlap with each other. Accordingly, when each of the relatively moving members arrives at a predetermined position in its moving stroke, the respective U-turn portions can be assembled at one location in a mutually fitted state, as shown in FIG. 2. (It should be noted that, in order to realize the state shown in FIG. 2, it is necessary to pay consideration to the moving stroke of each of the relatively moving members, the length of the FPC boards, and the like, and it goes without saying that such consideration is made at the time of designing the apparatus.)

As is apparent from FIGS. 1 and 2, as the structure for installing an FPC board in accordance with this embodiment is adopted, in the case of an apparatus having a plurality of FPC boards, it is possible to reduce the space necessary for movement of the U-turn portions of the FPC boards to several-fold, so that it is possible to prevent the apparatus from becoming large in size.

FIG. 3 is a diagram illustrating a structure in a case where the structure for installing an FPC board in accordance with this embodiment is not adopted in an apparatus having the same relatively moving mechanisms as those shown in FIG. 1. In FIG. 3, components denoted by the same reference numerals as those of FIG. 1 denote the same members as those of FIG. 1. (Incidentally, FIG. 3 shows a state in which the U-turn portions of the FPC boards are separated from each other.)

As is apparent from FIG. 3, in a case where the structure for installing an FPC board in accordance with this embodiment is not adopted, movement spaces for U-turn portions of the FPC boards are required separately, so that a large space must be provided within the apparatus. Consequently, the apparatus unavoidably becomes large.

As described above, in accordance with the structure for installing an FPC board of this embodiment, in an apparatus which is provided with a plurality of FPC boards having U-turn portions, it is possible to reduce the space for movement of the U-turn portions. Accordingly, it is possible to prevent the apparatus from becoming large in size, and the rate of effective utilization of the space within the apparatus can be improved.

A description will now be given of a second embodiment shown in FIGS. 4 and 5. To facilitate an understanding of the features of the second embodiment, with reference to FIGS. 6 to 9, a description will first be given of an apparatus to which the arrangement of the second embodiment is not applied.

Figure 7:
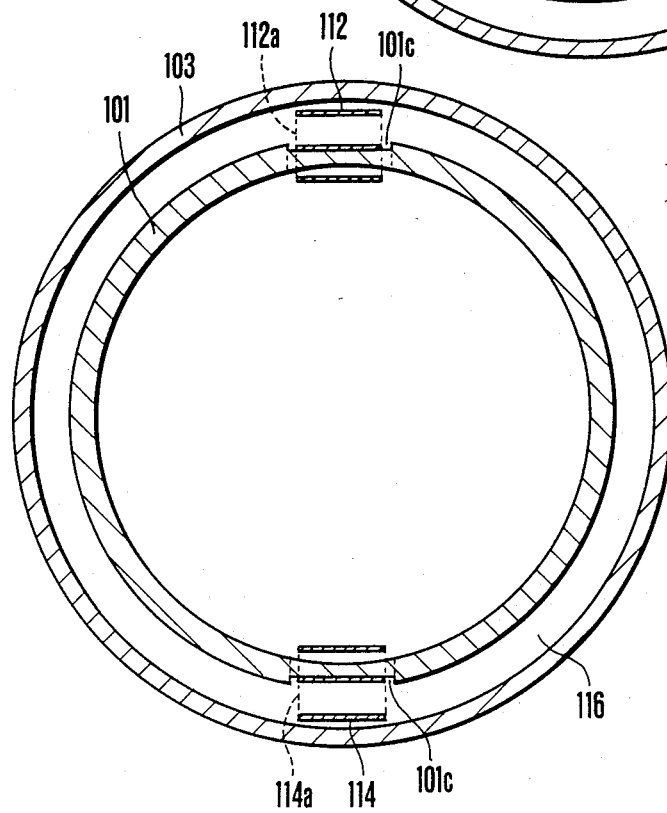
FIG. 7 is a cross-sectional view taken along line IV—IV of FIG. 6 in the direction of the arrows.
Figure 6:
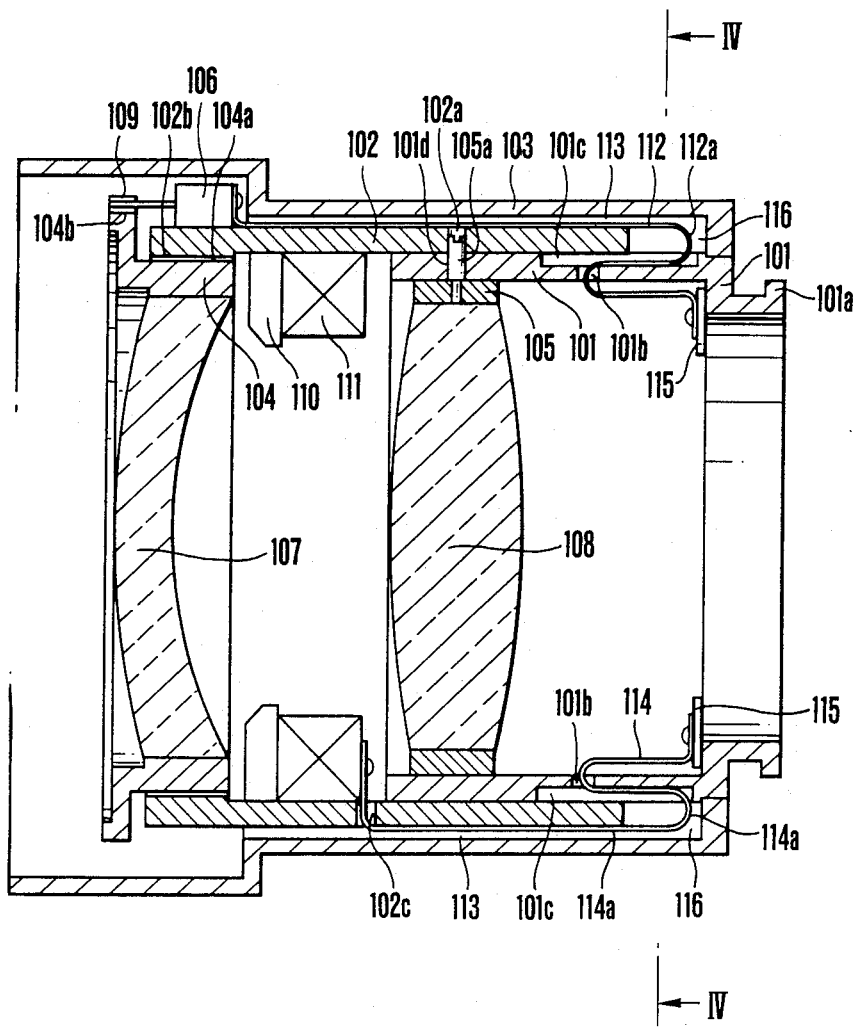
FIG. 6 is a vertical cross-sectional view of a known lens in which a conventional structure for installing an FPC board is adopted.

FIGS. 6 and 7 schematically illustrate a structure of a lens proposed by the present applicant which incorporates an electromagnetic diaphragm device and an autofocussing device. In the drawings, this lens comprises the following components: a fixed inner barrel 101 which has a known mount portion 101a at a rear end thereof and in which a spiral groove 101d is provided on a peripheral surface thereof; a straightly advancing barrel 102 which is fitted on an outer peripheral surface of the fixed inner barrel 101 in such a manner as to be relatively slidable and in which a cam groove 102a is provided on an outer peripheral surface thereof in a penetrating manner; a fixed outer barrel 103 fitted around the fixed inner barrel 101 and covering the straightly advancing barrel 102; a front lens holding barrel 104 which has on an outer peripheral surface thereof an external thread 104a threadingly engaging with an internal thread 102b provided on an inner peripheral surface of a tip portion of the straightly advancing barrel 102 and which is supported by the inside of the straightly advancing barrel 102 in such a manner as to be capable of advancing and retracting freely; a rear lens holding barrel 105 which has a pin 105a inserted in the spiral groove 101d of the fixed inner barrel 101 and the cam groove 102a of the straightly advancing barrel 102 and is fitted in the fixed inner barrel 101 in such a manner as to be axially movable; a front group of lenses 107 secured to the front lens holding barrel 104; a rear group of lenses 108 secured to the rear lens holding barrel 105; a focussing motor 106 secured to an outer peripheral surface of the straightly advancing barrel 102; a pinion 109 secured to a shaft of the motor 106; a gear 104b formed at a tip portion of the front lens holding barrel 104 and meshing with the pinion 109; a known diaphragm unit 110 secured to the inside of the straightly advancing barrel 102; an actuator 111 secured to the inside of the straightly advancing barrel 102 and adapted to drive the diaphragm unit 110; and a slit 102c provided in the straightly advancing barrel 102 to allow an FPC board 114 (which will be described later) to be inserted therethrough.

In the lens having the above-described structure, it has been necessary to provide on the inner side of the fixed outer barrel 103 the wiring for connecting a power source and a main control circuit disposed in a camera body and a focussing motor 106 so as to supply a current to the motor 106 and transmit a control signal thereto. In addition, it has also been necessary to provide on the inner side of the fixed outer barrel 103 the wiring for supplying a current to the diaphragm driving actuator 111 and transmitting a control signal thereto. For this reason, in the above-described lens, a belt-shaped first FPC board 112 for supplying a current to the motor 106 and transmitting a control signal thereto is provided in an annular space 113 between the fixed outer barrel 103 and the straightly advancing barrel 102, while the belt-shaped second FPC board 114 for supplying a current to the diaphragm driving actuator 111 and transmitting a control signal thereto is provided in the annular space 113 at a position spaced apart 180° with respect to the installation position of the first FPC board 112. Ends of the FPC boards 112 and 114 are respectively secured to the motor 106 moving integrally with the straightly advancing barrel 102 and the actuator 111, while the other ends of the FPC boards 112 and 114 are secured to a circuit board 115 which is integral with the fixed inner barrel 101. Therefore, it is necessary that there is a slackened portion between the fixing points of the FPC boards 112 and 114. Hence, U-turn portions 112a and 114a which move in response to the movement of the straightly advancing barrel 102 are formed at the FPC boards 112 and 114. These U-turn portions 112a and 114a are arranged in the annular space 116 within the fixed outer barrel 103 located rearwardly of the straightly advancing barrel 102, an axial recess 101c (see FIG. 7) formed in an outer peripheral surface of the fixed inner barrel 101. Thus, if the straightly advancing barrel 102 advances forward over the fixed inner barrel 101, the U-turn portions 112a and 114a also move forwardly.

In the structure for installing an FPC board in the lens having the above-described arrangement, the first FPC board 112, the second FPC board 114 are arranged at positions circumferentially spaced apart from each other, as shown in FIG. 7. Consequently, The annular spaces 113 and 116 between the fixed outer barrel 103, the fixed inner barrel 101 are used by the FPC boards 112 and 114, so that there has been the problem that it is difficult to make effective use of the annular spaces 113 and 116. Although it is desirable to dispose other FPC boards (in particular, an FPC board extending circumferentially) in the annular spaces 113 and 116, to dispose various types of electrical devices as many as possible, if the two FPC boards 112 and 114 are disposed in the annular spaces 113 and 116, the rate of utilization of these spaces becomes appreciably aggravated.

In addition, since two axial recesses 101c and slits 101b are formed on the outer peripheral surface of the fixed inner barrel 101, the mechanical rigidity of the fixing inner barrel 101 declines, and the machining costs for providing the recesses 101c and the slits 101b increases, with the result that there has also been the problem of higher costs.

Figure 8:
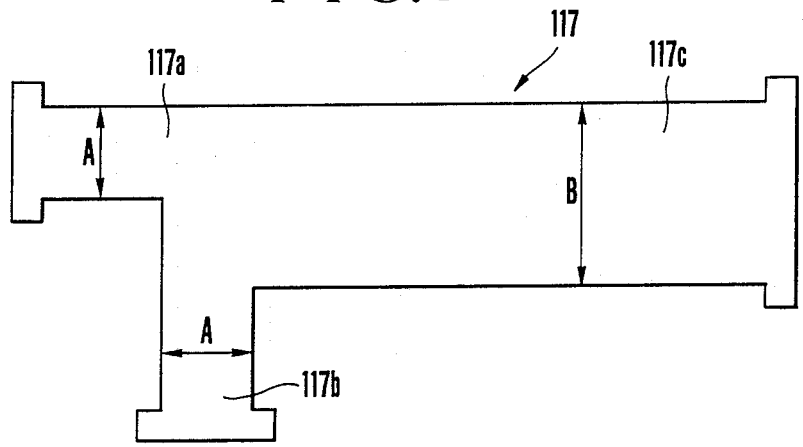
FIG. 8 is a top plan view of a conventional FPC board.
Figure 9:
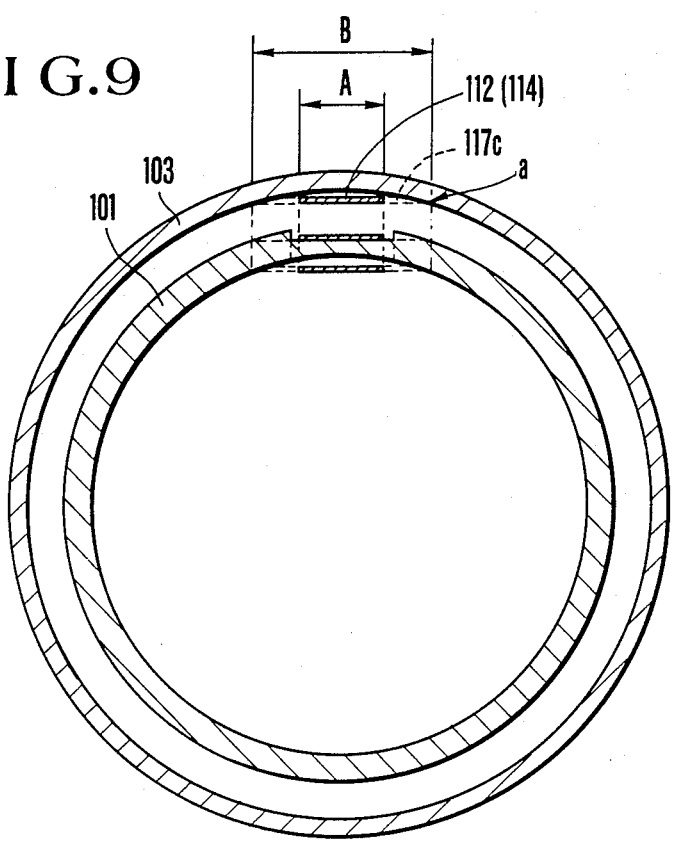
FIG. 9 is a horizontal cross-sectional view in a case where the FPC board of FIG. 8 is installed in a lens.

Therefore, as a method of overcoming the above-described problems, it has been conceived to employ a wide FPC board 117 in which the wiring on the first FPC board 112 and the wiring on the second FPC board 114 are formed so as to be parallel with each other, as shown in FIG. 8.

In the FPC board 117, the distal end side thereof branches off into a wiring portion 117a connected to the focussing motor 106 and a wiring portion 117b connected to the actuator 111, as shown in FIG. 8. In addition, a U-turn portion is formed in a parallel wiring portion 117c where the wirings of the two wiring portions extend parallel with each other. The widths A of the two wiring portions 117a and 117b are equivalent to the respective widths of the FPC boards 112 and 114, while the width B of the parallel wiring portion 117c is double the width A. Accordingly, if such a wide FPC board 117 is installed, the opposite side edges of the parallel wiring portion 117c disadvantageously come into contact with the inner peripheral surface of the fixed outer barrel 103 at a point a in FIG. 9, as shown by a dotted line. Hence, it has been necessary to partially cut off the inner peripheral surface of the fixed outer barrel 103 or enlarge the diameter (outside diameter) of the fixed outer barrel 103. However, there have been drawbacks in that the partial cutting off of the inner peripheral surface results in increased machining costs, and that the enlargement of the fixed outer barrel 103 disadvantageously makes the lens large in size, which in turn results in a large-sized camera. Moreover, since the parallel wiring portion 117c is wide, the axial recesses 101c and the slits 101b in the fixed inner barrel 101 also become wide, so that there has been a drawback in that the mechanical rigidity of the fixed inner barrel 101 declines.

The structure for installing an FPC board in accordance with a second embodiment is characterized in that the U-turn portions of the FPC boards are arranged so as to be superposed on each other. According to the structure for installation of this embodiment, it is possible to increase the rate of effective utilization of the annular space, and to prevent the lens from becoming large in size and production costs from becoming higher, while it is possible to increase the mechanical rigidity of the fixed inner barrel.

Figure 4:
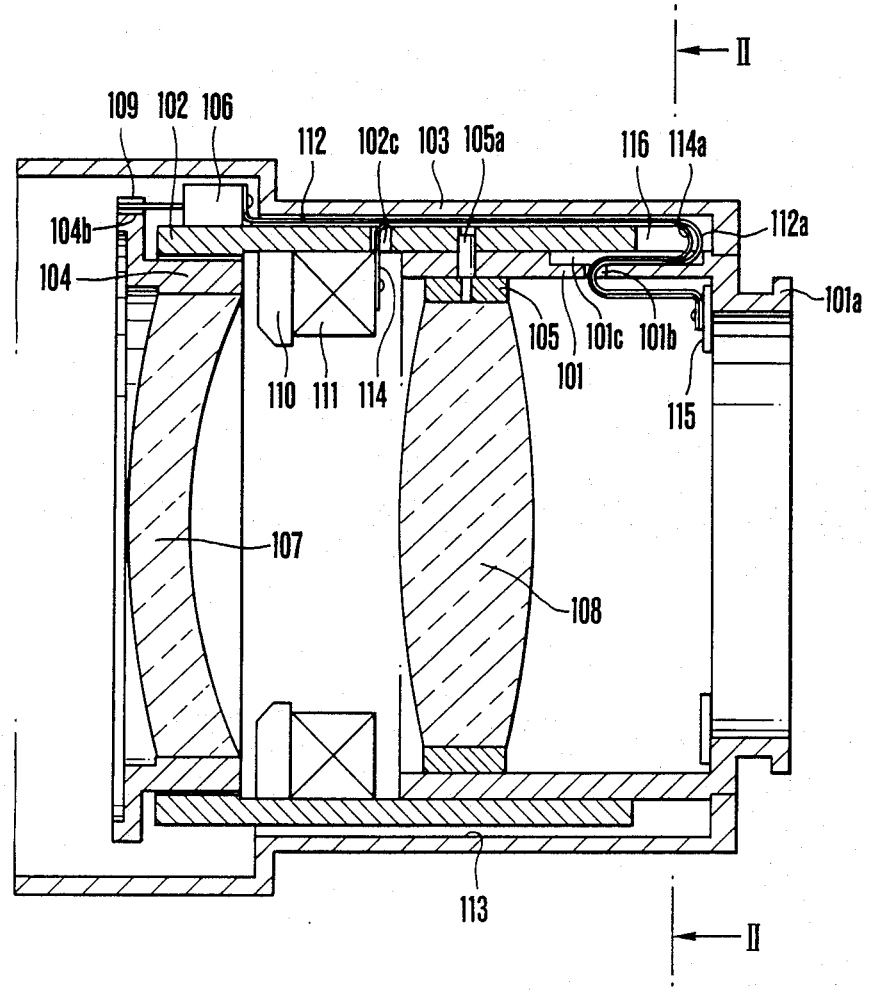
FIG. 4 is a vertical cross-sectional view of a lens in which the structure for installing an FPC board in accordance with a second embodiment of the present invention is adopted.
Figure 5:
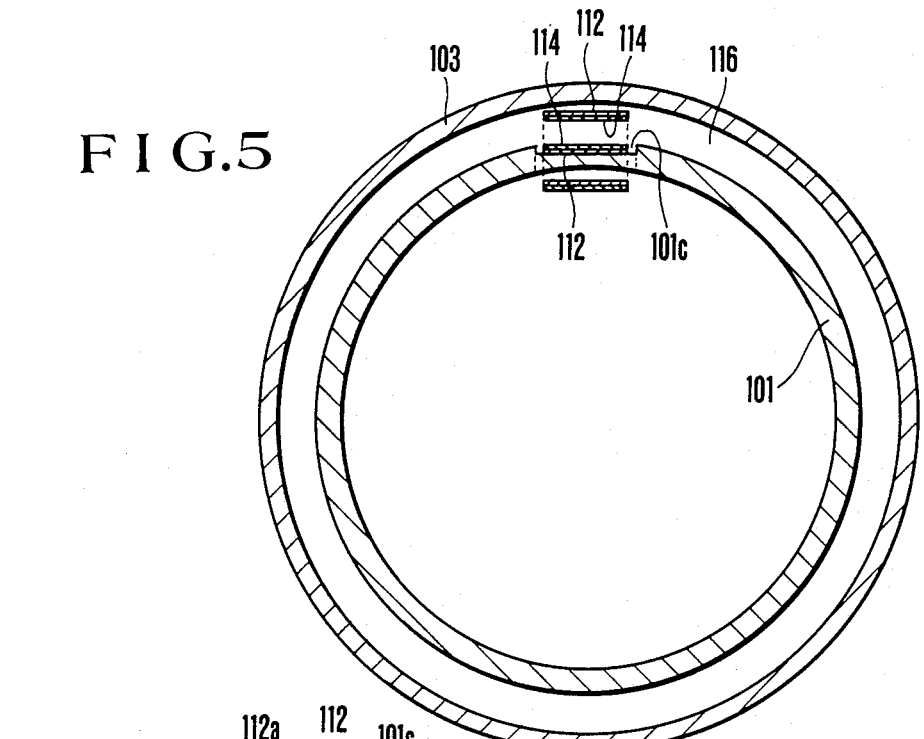
FIG. 5 is a cross-sectional view taken along the line II—II of FIG. 4 in the direction of the arrows.

Referring now to FIGS. 4 and 5, a description will be given of the second embodiment. In FIGS. 4 and 5, those components or portions that are denoted by the same reference numerals as those of FIGS. 6 and 7 are identical with those shown in FIGS. 6 and 7, so that a description thereof will be omitted, unless necessary.

As shown in FIGS. 4 and 5, in the lens to which the structure for installing an FPC board in accordance with the second embodiment is applied, the conventional FPC boards 112 and 114 are disposed inside the annular space 116 in an overlapping manner. Accordingly, the FPC boards occupy only one location on an arc inside the annular space. Hence, as is apparent from FIG. 5, the annular space is not split into two semi-arcuate spaces, so that it is possible to increase the rate of utilization of the annular space. In addition, since the widths or the respective FPC boards are identical with those of FIGS. 6 and 7, it is not necessary to enlarge the diameters of the fixed outer barrel 103, the fixed inner barrel 101, and the straightly advancing barrel 102. Similarly, there is no need to enlarge the width of the axial recess 101c on the outer peripheral surface of the fixed inner barrel 101, and there is no need to enlarge the width (circumferential length) of the slit 101b in the fixed inner barrel 101. Moreover, since it is possible to reduce the numbers of the recesses 101c and the slits 101b as compared with those of the conventional structure, it is possible to reduce the machining costs and to increase the mechanical rigidity of the fixed inner barrel 101.

With the installation structure in accordance with the second embodiment, the greater the number of the FPC boards, the more advantageous as compared with the structure shown in FIG. 6. Hence, the more highly automated the optical instrument is to which the structure of this embodiment is applied, the more effective it is in reducing the costs and preventing the apparatus from becoming large in size.

As is apparent from the above-described embodiment, in accordance with the second embodiment, it is possible to prevent an apparatus from becoming large in size and to effect a cost reduction.

A description will now be given of a third embodiment with reference to FIGS. 10 and 11. This embodiment shows a case where the structure for installing an FPC board is applied to a telescopic sensor head.

Figure 10:
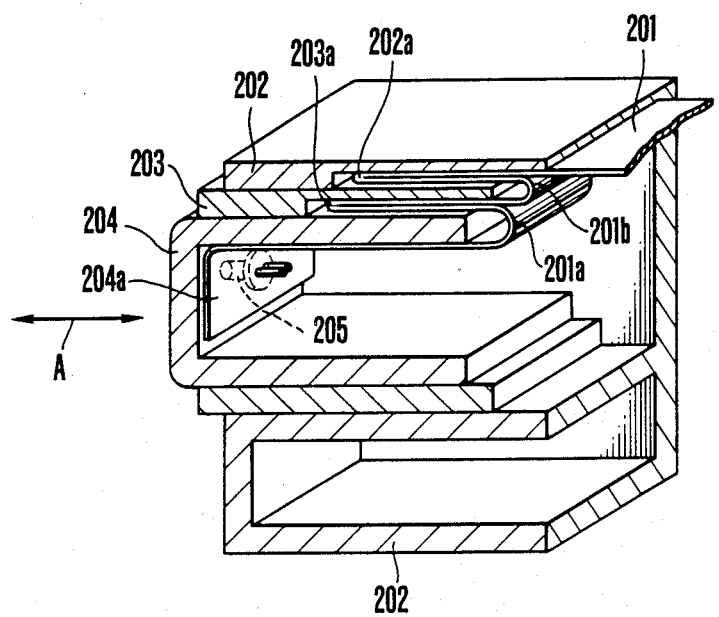
FIG. 10 is cross-sectional view illustrating the first state of the apparatus to which the structure for installing an FPC board in accordance with a third embodiment of the present invention is applied.
Figure 11:
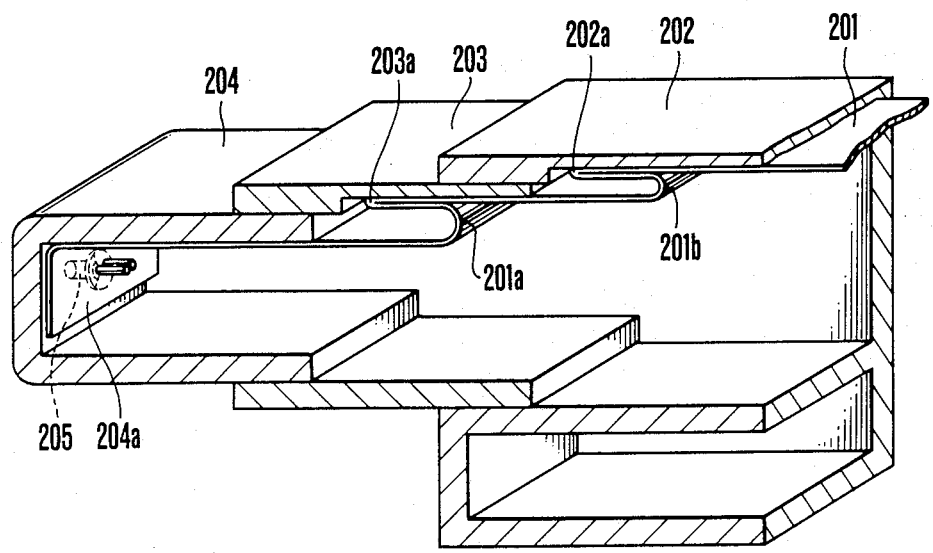
FIG. 11 is a cross-sectional view illustrating a second state of the apparatus shown in FIG. 10.

In FIGS. 10 and 11, the telescopic sensor head comprises the following components: a belt-shaped FPC board 201; first to third members 202-204 which move relative to and parallel with each other; and a sensor 205 carried by the third member 204. The first member 202 is supported by a structure (not shown), and has a hole for accommodating the second member 203 in such a manner as to be relatively slidable in the direction of the arrows A. The second member 203 is a tubular body (or a non-tubular body) whose tip is open (left-hand side in FIG. 10). This second member 203 is inserted in the hole of the first member 202 and is slidable relative to the first member 202 in the direction of the arrows A. The third member 204 is a tubular body (or non-tubular body) whose tip (left-hand end in FIG. 10) is closed, the sensor 205 projecting from a tip surface thereof. The third member 204 is supported inside the second member 203 in such a manner as to be relatively slidable in the direction of the arrows A. Indented portions for allowing the FPC board 201 to be inserted therethrough are respectively formed in the inner surfaces of the first and second members 202 and 203. The FPC board 201 is folded back in the indented portions, and is secured to the first and second members 202 and 203 at positions 202a and 203a.

In addition, the FPC board 201 is secured to the third member 204 at a position 204a, and is bent into a U-shape shape at a place where it enters the indented portion of the second member 203 after emerging from the third member 204, while it is again formed into a U-shape at a place where it enters the indented portion of the first member 202 after emerging from the indented portion of the second member 203. Since these bent portions, i.e., U-turn portions 201a and 201b are not formed by subjecting the FPC board 201 to plastic deformation, when the third member 204 and the second member 203 are moved in the direction of the arrows A, the U-turn portions 201a and 201b also move in the moving direction of these members 204 and 203.

FIG. 11 shows a state in which the second and third members 203 and 204 are moved leftwardly, as viewed in the drawing, relative to the first member 202. At this time, the two U-turn portions 201a and 201b of the FPC board 201 move leftwardly from the position shown in FIG. 10, and the U-turn portions 201a and 201b assume a positional relationship in which they are offset from each other.

The characteristic feature of the structure of this embodiment is that, in the relatively moving process of the first member 202 to the third member 204, all the U-turn portions 201a and 201b assume a state in which they are assembled at a particular position (i.e., the state shown in FIG. 10) during a particular time. Thus, since all the U-turn portions are assembled at a particular position, the length (the length of each of the members in the moving direction) of the FPC board 201 becomes minimum, with the result that it is possible to extend or contract the FPC board by a large degree.

The embodiment shown in FIGS. 10 and 11 illustrate a case where the U-turn portions are disposed so as to be in parallel with each other, but the U-turn portions may be arranged in such a manner so as to be superposed on each other.

Figure 12:
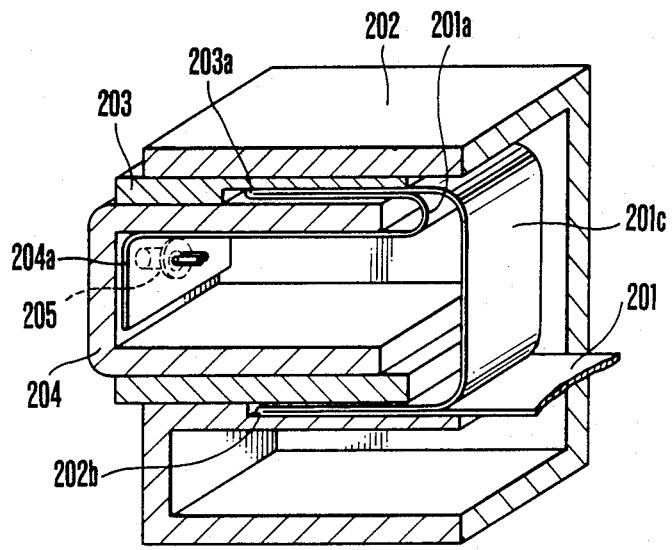
FIG. 12 is a cross-sectional view illustrating a first state of the apparatus to which the structure for installing an FPC board in accordance with a fourth embodiment of the present invention is applied.
Figure 13:
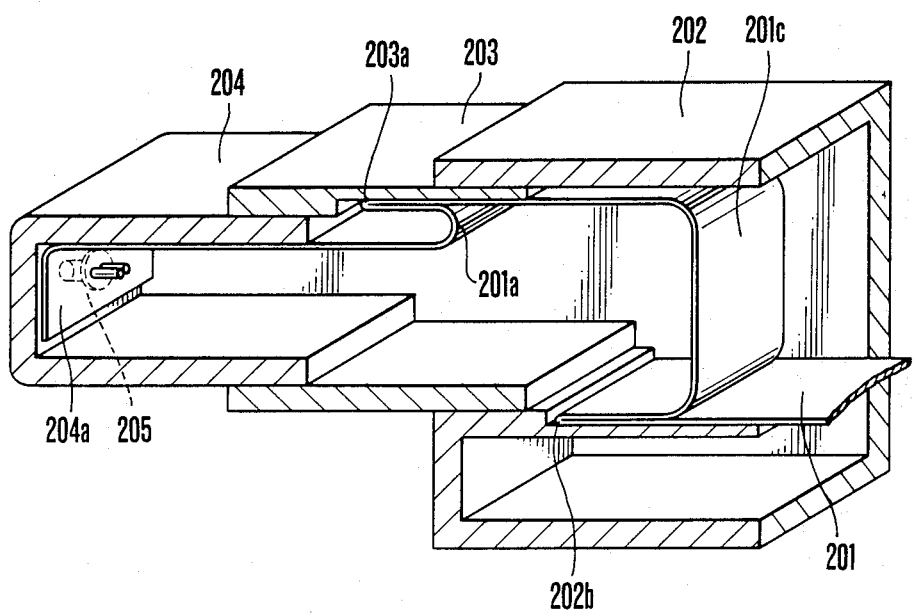
FIG. 13 is a cross-sectional view illustrating a second state of the apparatus shown in FIG. 12.

In the fourth embodiment shown in FIGS. 12 and 13, the apparatus to which the FPC board is installed is the same sensor head as the one shown in FIGS. 10 and 11, but the structure for installing the FPC board is different from that shown in FIGS. 10 and 11. Namely, in this embodiment, after the FPC board 201 is secured to the second member 203 at the point 203a within the indented portion on the inner peripheral side of the second member 203, the FPC board 201 is bent toward the opposite side to that shown in FIG. 10 in such a manner as to cover a rear end surface of the third member 204 and is inserted into the indented portion in the inner peripheral surface of the first member 202, and is secured to the first member 202 at a point 202b. Therefore, a second U-turn portion 201c is made large enough to include the first U-turn portion 201a. Accordingly, in this embodiment, in the state shown in FIG. 12 in which the relative distances among the members 202 to 204 have become minimal (i.e., zero), the U-turn portions are superposed on each other, while, in the state shown in FIG. 13 in which the relative distances among the members are not zero, the U-turn portions 201a and 201c are separated from each other in the direction of relative movement of the members.

Figure 14A:
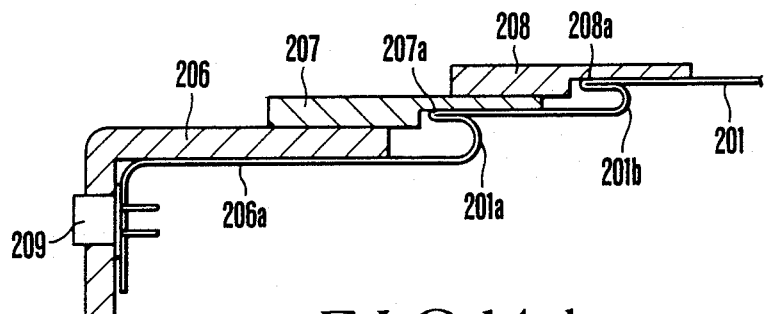
FIGS. 14(a) and 14(b) are cross-sectional views of another apparatus to which the installation structure shown in FIG. 10 is applied.
Figure 14B:
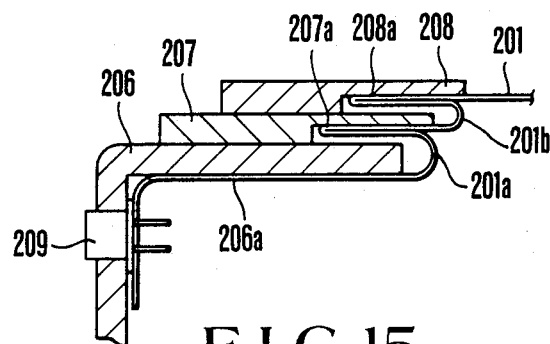

In the embodiment shown in FIGS. 14(a) and 14(b), a non-tubular telescopic apparatus is shown to which the same installation structure as that shown in FIG. 10 is applied. In the drawings, the apparatus comprises the following components: members 206 to 208 adapted to move relative to and parallel with each other; a electrical part 209 to which a current needs to be supplied; the FPC board 201; and U-turn portions 201a and 201b moving parallel with each other in the direction of movement of the members 207 and 208 in conjunction with the movement of the members 207 and 208, the FPC board 201 being secured to the members 206 to 208 at points 206a to 208a. Since the structure for installing an FPC board in accordance with this embodiment is the same as that of FIG. 11, the movement of the FPC board 201 in conjunction with the movement of the apparatus is the same as that of FIGS. 10 and 11. As the longitudinal relative distances among the members 206–208 approach zero as shown in FIG. 14(b), all the U-turn portions 201a and 201b of the FPC board 201 are assembled toward a particular position.

The embodiments shown in up to FIGS. 14(b) illustrate the case where the number of relatively moving members is three; however, the same effect can be obtained regardless of the number of the relatively moving members (i.e., when the relative distances among the relatively moving members have become zero, all the U-turn portions are assembled at a particular position, so that the length of the FPC board parallel with the moving direction of the members becomes minimum).

Figure 15:
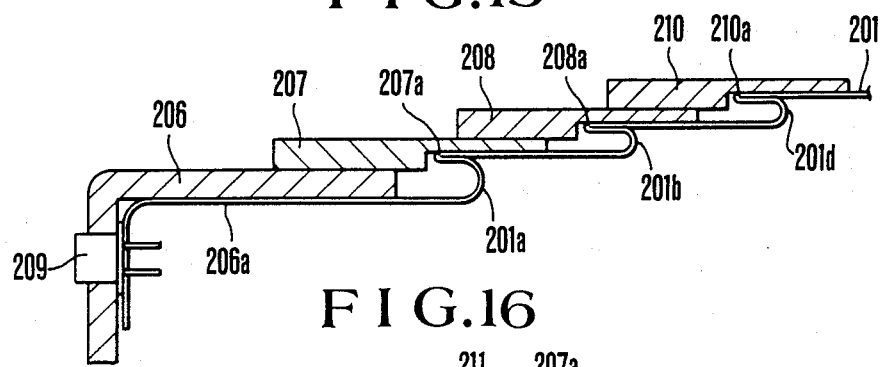
FIG. 15 is a cross-sectional view of a similar apparatus to which the installation structure shown in FIG. 10 is applied.
Figure 16:
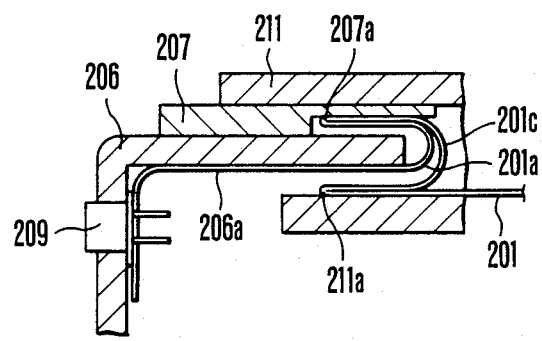
FIG. 16 is a cross-sectional view of an apparatus to which the installation structure shown in FIG. 13 is applied.

FIG. 15 shows the case of a non-tubular telescopic apparatus in which the number of the relatively moving members is one more than in the embodiment shown in FIGS. 14(a) and 14(b). Incidentally, in FIG. 15, reference numerals 206a to 210a denote fixing points for fixing the FPC board 201 to respective members 206 to 210, while reference numerals 201b and 101d denote the U-turn portions of the FPC board 201. FIG. 16 illustrates a structure of the telescopic apparatus in which the FPC board 201 is installed with the same installation structure as that of FIG. 12. Since this apparatus comprises the same components as those of FIG. 15, the same components in this drawing are denoted by the same reference numerals.

In FIG. 16, a member 211 is capable of moving relatively to the member 207, and the FPC board 201 is secured at a point 211a of the member 211. The FPC board is secured to the member 206 at the point 206a and to the member 207 at the point 207a, the U-turn portions 201a and 201c being respectively formed between the fixing points. FIG. 16 illustrates the case where the relative distances among the members have become zero, and the U-turn portion 201a is accommodated in the U-turn portion 201c. In the state shown in FIG. 16, if the members 206 and 207 move leftwardly, the U-turn portion 201a leaves the U-turn portion 201c and moves leftward, while the U-turn portion 201c also moves leftward.

Figure 17:
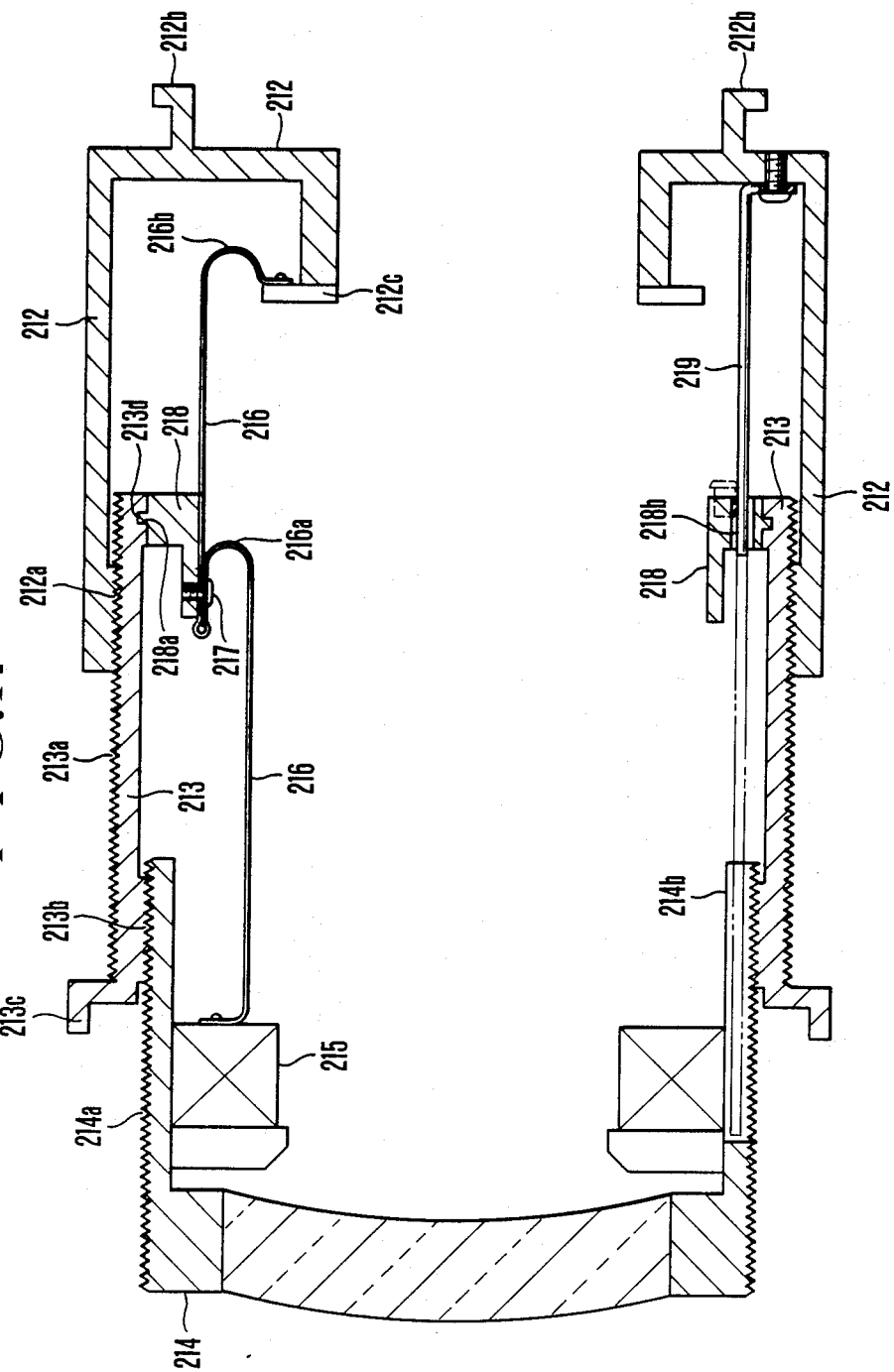
FIGS. 17 and 18 are vertical cross-sectional views of a lens for a camera to which the second installation structure in accordance with a fifth embodiment is applied.
Figure 18:
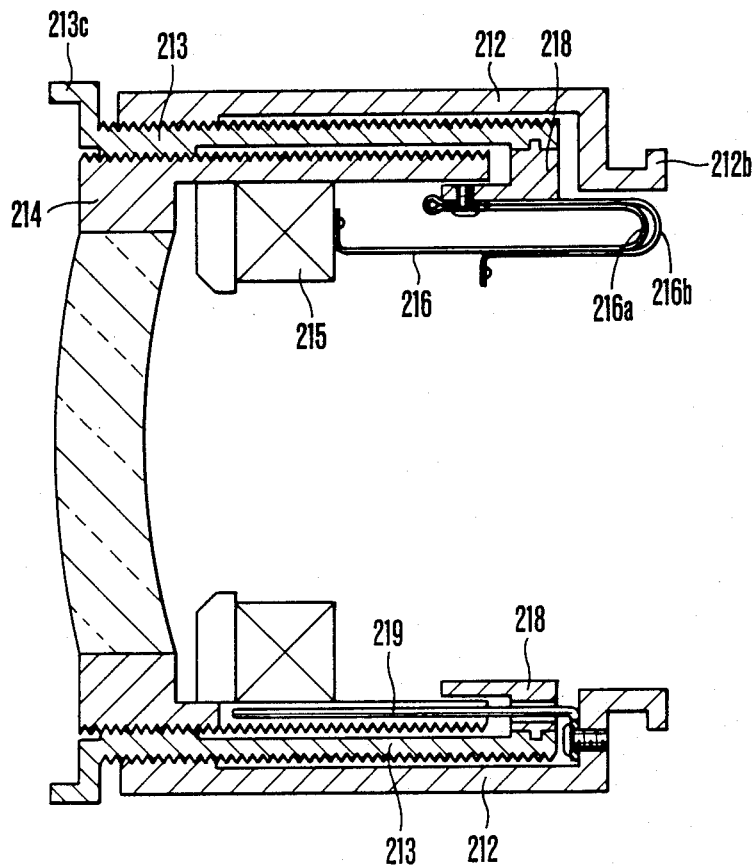

FIGS. 17 and 18 illustrate an embodiment in which the structure for installing an FPC board in accordance with a fifth embodiment is applied to a lens for a camera.

In FIGS. 17 and 18, a fixed outer barrel 212 is provided with a known mount 212b at a rear end thereof, and this fixed outer barrel 212 is secured to a mount on a camera body (not shown) by the mount 212b. An internal thread 212a is formed on an internal peripheral surface of a tip portion of the fixed outer barrel 212, and a rear lens-barrel 213 having on an outer peripheral surface thereof an external thread 213a engaging with the internal thread 212a is fitted in the fixed outer barrel 212.

The rear lens-barrel 213 has around an outer peripheral surface of a tip portion thereof an operational annular portion 213c for being rotated with fingers or the like, and has on an inner peripheral surface of the tip portion thereof an internal thread 213b engaging with an external thread 214a of an outer peripheral surface of a front lens-barrel 214. The front lens-barrel 214 incorporates a diaphragm mechanism (not shown), an actuator 215 for driving the diaphragm mechanism, and a control circuit.

A belt-shaped FPC board 216 for feeding power and transmitting a control signal to the actuator 215 and the control circuit extends from the inside of the front lens-barrel 214 to the vicinity of a rear-end portion of the fixed outer barrel 212. The front end of the FPC board 216 is secured to the actuator 215, while the rear end of the FPC board 216 is connected to a printed circuit board 212c secured to a rear flange of the fixed outer barrel 212.

An intermediate portion of the FPC board 216 is bent into a U-shape to form a first U-turn portion 216a, and is then secured to a ring 218 by means of a screw 217. Meanwhile, a rear end portion of the FPC board 216 is bent into a U-shape to form a second U-turn portion 216b, and is then secured to the rear flange of the fixed outer barrel 212.

The two U-turn portions 216a and 216b are formed along an identical line parallel with the axis of the lens, and the radius of curvature of the rear U-turn portion 216b is slightly greater than that of the front U-turn portion 216a. Therefore, when both the front lens-barrel 212 and the rear lens-barrel 213 are inserted in the fixed outer barrel 212, as shown in FIG. 18, the front U-turn portion 216a enters the rear U-turn portion 216b, and the two U-turn portions are superposed on each other.

The ring 218 for fixing the intermediate portion of the FPC board 216 is supported by the rear lens-barrel 213 by means of a structure which will be described below, so that the ring 218 will not rotate. The ring 218 is thus capable of moving integrally with the rear lens-barrel 213 in the axial direction.

Namely, a projection 218a extending circumferentially is formed on an outer peripheral surface of the ring 218, and the projection 218a is inserted in a circumferential groove 213d formed in an inner peripheral surface of the rear lens-barrel 213 in such a manner as to be relatively slidable. By virtue of this structure, the ring 218 is supported in such a manner as to be rotatable relative to the rear lens-barrel 213 but incapable of moving relative to the rear lens-barrel 213 in the axial direction. In addition, an elongated key 219 is secured to the fixed outer barrel 212 so as to guide the ring 218 and the front lens-barrel 214 in the axial direction and to prevent the same from rotating, while axial holes 218b and 214b respectively fitting with the key 219 with play are formed in the ring 218 and the front lens-barrel 214.

Accordingly, the ring 218 is capable of moving in the axial direction together with the rear lens-barrel 213, but the ring 218 does not rotate even if the rear lens-barrel 213 rotates.

A description will now be given of the operation of each portion in a case where, in the above-described arrangement, both the rear and front lens-barrels 213 and 214 are retracted into the fixed outer barrel 212 from the state in which both the rear and front lens-barrels 213 and 214 are moved forward as shown in FIG. 17.

To retract the lens-barrels 213 and 214, the operational annular portion 213c of the rear lens-barrel 213 is rotatively controlled with fingers. Then, since the rear lens-barrel 213 rotates, the front lens-barrel 214 threadingly engaged with the lens-barrel 213 begins to retract axially without rotating, and is retracted into the rear lens-barrel 213. Meanwhile, the rear lens-barrel 213 is retracted into the fixed outer barrel 212 while being rotated because of its threadingly engaged relationship with the fixed outer barrel 212. At this time, the ring 18 moves axially with the rear lens-barrel 213 without rotating.

When the front lens-barrel 214 and the ring 218 are retracted, axial forces are respectively applied to the tip and intermediate portions of the FPC board 216 by means of the front lens-barrel 214 and the ring 218, so that the U-turn portions 216a and 216b also start to move rearwardly. However, since the retracting speed of the front lens-barrel 214 is greater than that of the rear lens-barrel 213, the U-turn portion 216a approaches the U-turn portion 216b. When both of the lens-barrels 213 and 214 are completely retracted in the fixed outer barrel 212, as shown in FIG. 18, the U-turn portion 216a enters the U-turn portion 216b, and the U-turn portion 216b stops at a position slightly forwardly of the mount 212b.

As shown in FIGS. 17 and 18, since the adoption of the structure for installing an FPC board in accordance with this embodiment allows an amount of expansion and contraction of the FPC board to be enlarged substantially, it is possible to provide a lens with an electrically operated diaphragm which is capable of substantially decreasing the overall length of the lens when retracted and substantially increasing the overall length thereof when extended.

Figure 19:
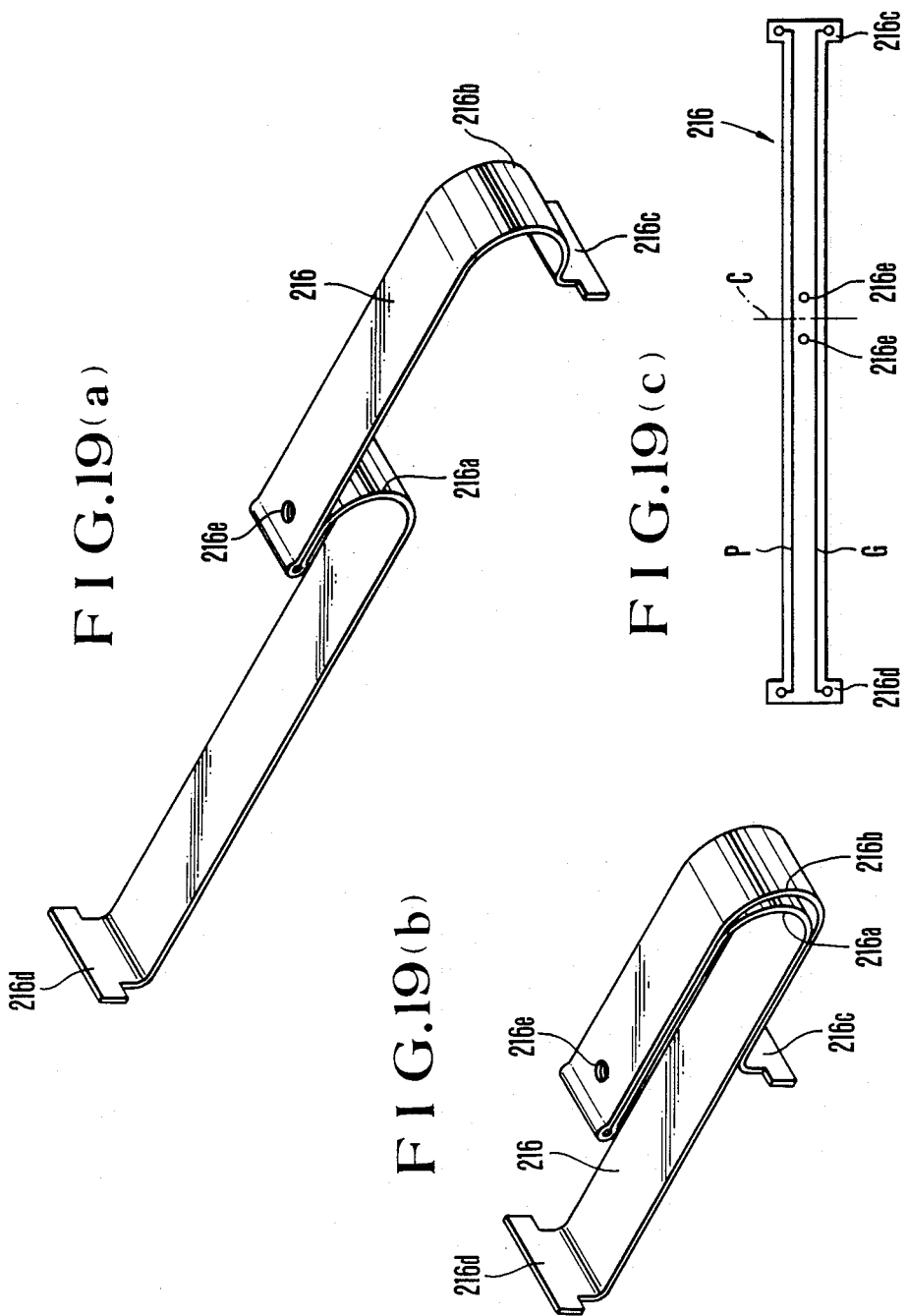
FIGS. 19(a) and 19(b) are perspective views illustrating a configuration of an FPC board which is applied to the structure for installing an FPC board shown in FIG. 17.
FIG. 19(c) is an extended top plan view of the FPC board shown in FIGS. 19(a) and 19(b)

FIGS. 19(a) to 19(c) illustrate the FPC board 216 which is used in the embodiment shown in FIGS. 17 and 18, in which FIG. 19(a) shows an extended state, while FIG. 19(b) shows a contracted state. FIGS. 19(a) and 19(b) illustrate a state in which the FPC board 216 is installed in an apparatus, and before it is installed in the apparatus the FPC board 216 has a flat configuration, as shown in FIG. 19(c). In FIGS. 19(a) to 19(c), reference numerals 216a and 216b denote the U-turn portions described in connection with FIG. 17; numerals 216c and 216d denote portions for installation on the first and third relatively moving members; and numeral 216e denotes a hole for insertion of the screw 217 therethrough (i.e., a portion for installation on the second relatively moving member). To obtain a configuration such as the one shown in FIG. 19(a), it suffices if the FPC board 216 is folded at an intermediate position C between the two holes 216e, and the portion where the installation portion 216c is located and the portion where the installation portion 216d is located are made to face the opposite direction with respect to each other. Incidentally, when a power line P and a ground line G are to be provided on the FPC board 216, it suffices if the two lines are provided separately from each other and connecting lands are formed respectively on the installation portions 216c and 216d.

Figure 20:
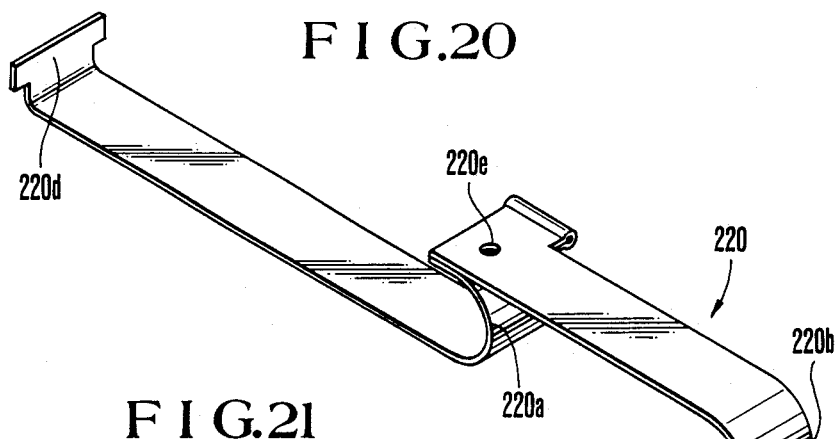
FIG. 20 is a perspective view of another FPC board which is applied to the installation structure shown in FIG. 17.
Figure 21:
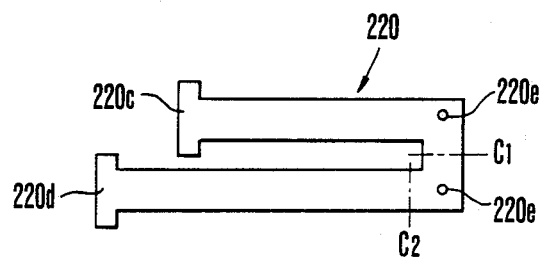
FIG. 21 is an extended top plan view of the FPC board shown in FIGS. 20 and 22.

An FPC board 220 shown in FIG. 20 is of the type in which two U-turn portions 220a and 220b are fitted with each other, in the same way as the FPC board 216 shown in FIGS. 19(a) to 19(c). Although in terms of its function, the FPC board 220 is identical with the FPC board 216 shown in FIGS. 19(a) to 19(c), its configuration when extended into a plan is shown in FIG. 21. Incidentally, in FIG. 21, $C_1$ denotes a folding position for forming a three-dimensional FPC board; 220c and 220d denote installation portions; and 220e denotes a screw insertion hole constituting a portion of installation on the second relatively moving member.

Figure 22:
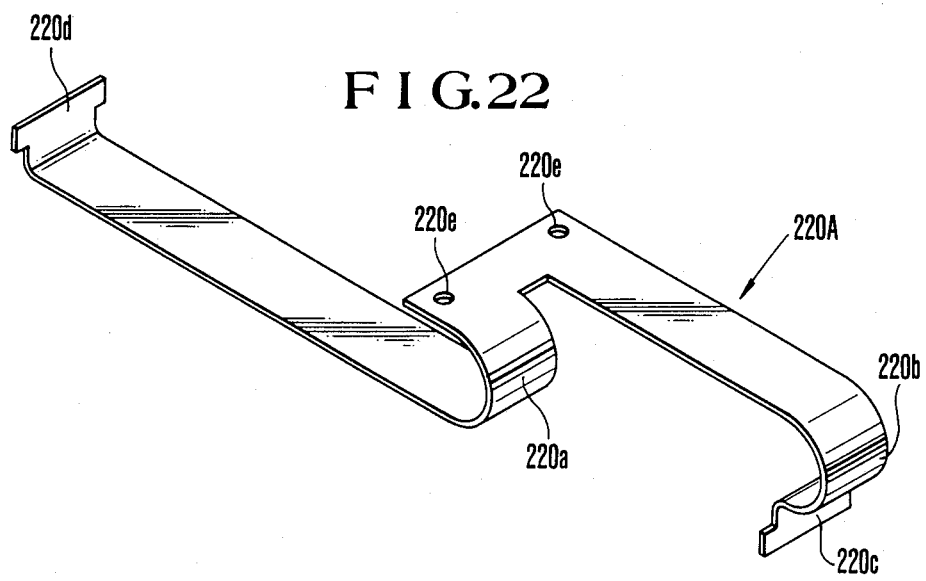
FIG. 22 is a perspective view of the flat FPC board shown in FIG. 20.

FIG. 22 shows another FPC board 220A which is obtained by bending the flat FPC board 220 shown in FIG. 21, at another position $C_2$. The FPC board 220A shown in FIG. 22 is applicable to the installation structure of the type in which a plurality of the U-turn portions are assembled in parallel with each other, as in the case of the embodiment shown in FIGS. 14(a), 14(b) and 15.

Figure 23:
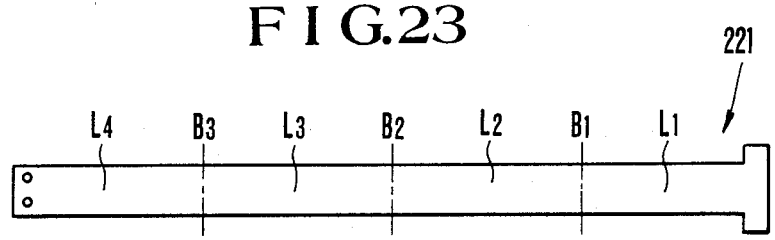
FIGS. 23 and 24 are extended top plan views of an FPC board having four U-turn portions.

FIG. 23 is a development of the FPC board 221 of the type in which four U-turn portions are arranged along a straight line. When this FPC board 221 is formed into a three-dimensional configuration, four linear portions $L_1$ to $L_4$ are formed by bending it at dotted lines $B_1$ to $B_3$, the FPC board 221 is secured to the relatively moving members at both ends of the linear portions, and U-turn portions are formed in the respective linear portions.

Figure 24:
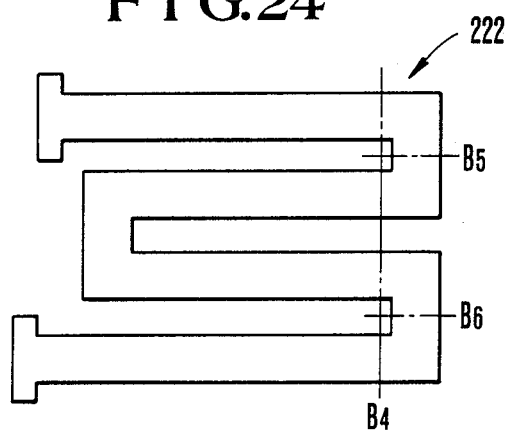

FIG. 24 is a development of an FPC board of the type in which four U-turn portions are arranged in parallel with each other (a type similar to the FPC board 220A shown in FIG. 22) or an FPC board of the type in which a pair of the FPC boards 220 shown in FIG. 20 are arranged in parallel with each other.

If this FPC board 222 is bent at a dotted line $B_4$ of the drawing, its arrangement becomes one in which a pair of the FPC boards 220A shown in FIG. 22 are arranged in parallel, and if it is folded at dotted lines $B_5$ and $B_6$, its arrangement becomes one in which a pair of FPC boards 220 shown in FIG. 20 are arranged in parallel.

Figure 25:
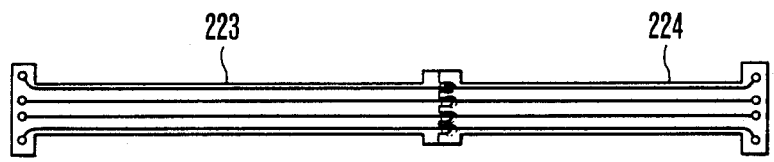
FIGS. 25 and 26 are diagrams illustrating two examples of an FPC board made by combining two FPC boards.

The flat one shown in FIG. 19(c) and another flat one shown in FIG. 23 are the simplest in terms of the structure and easy to manufacture; however, there are in which their length becomes large, making it difficult to handle. In such a case, they may not be formed integrally, and the two FPC boards 223 and 224 may be joined together, as shown in FIG. 25. In this case, to connect the wirings of the two FPC boards 223 and 224 in the junction of the the FPC boards, lands for soldering may be formed in advance, and the wirings of both boards may be connected at the time of joining of the two boards.

Figure 26:
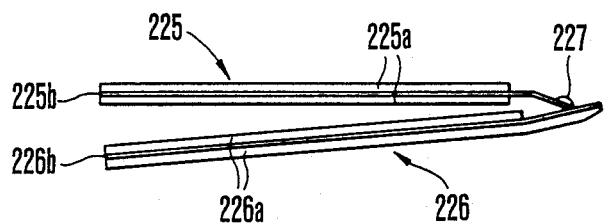

FIG. 26 is a cross-sectional view of a folded FPC board formed by joining the two FPC boards 225 and 226 at ends thereof. In the drawing, reference numerals 225a and 226a denote insulating coatings; 225b and 226b denote wirings; and 227 denotes solder.

As described above, in the structure for installing an FPC board in accordance with the third to fifth embodiments, a plurality of U-turn portions of the FPC board are superposed on each other at a particular position or assembled in parallel at a particular position during a specific time in the relatively moving process of relatively moving members. Accordingly, an amount of extension or contraction of the FPC board in the moving direction of the relatively moving members can be made very large, and the overall length of the FPC board when it is accommodated can be made short. Accordingly, it is possible to supply power between movable members whose amount of relative movement is large.

What is claimed is:

1. A structure for installing a flexible printed circuit board which is retained in a state in which a plurality of U-turn portions are formed in members which move relatively to and parallel with each other, comprising:
   means for allowing at least two of said plurality of U-turn portions to be arranged on a straight line such that at least parts of the moving paths of said plurality of U-turn portions are overlapped with each other; and
   means for determining positions at which said members are retained such that said plurality of U-turn portions assemble together at a particular timing in the relatively moving strokes of said members.

2. A structure according to claim 1, wherein said members include at least a first member, a second member, a third member, and a fourth member; said flexible printed circuit boards include at least a first flexible printed circuit board retained by said first member and said second member and having a first U-turn portion formed in a substantially intermediate portion thereof and a second flexible printed circuit board retained by said third member and said fourth member and having a second U-turn portion formed in a substantially intermediate portion thereof; said first and second U-turn portions are arranged in a straight line such that at least parts of a moving path of said first U-turn portion moving in response to the relative movement of said first member and said second member and a moving path of said second U-turn portion moving in response to the relative movement of said third member and said fourth member overlap with each other; and positions at which said members are retained are determined such that said first and second U-turn portions assemble together at a particular timing of the relatively moving strokes of said members.

3. A structure according to claim 1, wherein said members include at least a first member, a second member, and a third member; said flexible printed circuit board includes at least a first area retained by said first member and said second member and having a first U-turn portion in a substantially intermediate portion of said flexible printed circuit board and a second area retained by said second member and said third member and having a second U-turn portion formed in a substantially intermediate portion of said flexible printed circuit board; said first and second U-turn portions are arranged in a straight line such that at least parts of a moving path of said first U-turn portion moving in response to the relative movement of said first member and said second member and a moving path of said second U-turn portion moving in response to the relative movement of said second member and said third member overlap with each other; and positions at which said members are retained are determined such that said first and second U-turn portions are assembled together at a particular timing of the relatively moving strokes of said members.

4. A structure for installing flexible printed circuit boards for allowing a plurality of belt-shaped flexible printed circuit boards to be installed in an apparatus having an annular space extending axially, said flexible printed circuit boards extending axially within said annular space, said structure comprising:
means for forming turn portions respectively in said plurality of flexible printed circuit boards, said turn portions extending to outside said annular space,
wherein said plurality of flexible printed circuit boards are arranged such that said turn portions and portions thereof extending within said annular space overlap with each other in the radial direction.

5. A structure according to claim 4, further comprising means for connecting said plurality of flexible printed circuit boards respectively to electrical devices moving axially.

6. A structure according to claim 5, wherein said turn portions of said plurality of flexible printed circuit boards include a U-turn configuration.

7. A structure according to claim 5, wherein said turns of said plurality of flexible printed circuit boards are constituted by an S-turn configuration.

8. A structure for installing flexible printed circuit boards for allowing a plurality of belt-shaped flexible printed circuit boards in a lens-barrel having an annular space extending in the direction of an optical axis, said plurality of belt-shaped flexible printed circuit boards extending within said annular space in the direction of said optical axis, said structure comprising:
means for forming turn portions respectively in said plurality of flexible printed circuit boards, said turn portions extending to outside said annular space,
wherein said plurality of flexible printed circuit boards are arranged such that said turn portions and portions thereof extending within said annular space overlap with each other in a direction perpendicular to said optical axis.

9. A structure according to claim 8, wherein said annular space is formed between two barrels having different diameters.

10. A structure according to claim 9, further comprising: axially moving electrical devices respectively connected to ends of said plurality of flexible printed circuit boards and fixed electrical devices connected to the other ends thereof.

11. A structure according to claim 10, wherein actuators are used as said moving electrical devices, and circuit boards are used as said fixed electrical devices.

12. A structure according to claim 10, wherein said moving electrical devices are fixed directly or indirectly to a movable barrel moving in the direction of said optical axis.

13. A structure according to claim 9, wherein said turn portions of said plurality of flexible printed circuit boards include a U-turn configuration.

14. A structure according to claim 9, wherein said turns of said plurality of flexible printed circuit boards are constituted by an S-turn configuration.

15. A structure for installing a flexible printed circuit board for allowing a flexible printed circuit board to be installed on an n (n≧3) number of members moving relative to and parallel with each other, said structure comprising:
means for providing an n number of fixing points by fixing said flexible printed circuit board at one point of each of said members;
means for forming a U-turn portion between said fixing points, said U-turn portion moving in response to the movement of each of said members; and
means for determining the positions of said U-turn portions such that at least two of said U-turn portions are assembled together at a substantially identical position at a particular timing of the relatively moving strokes of said members.

16. A structure according to claim 15, wherein said at least two of said U-turn portions are assembled in the direction of the thickness of said flexible printed circuit board.

17. A structure according to claim 15, wherein said at least two of said U-turn portions are assembled in such a manner as to be superposed on each other.

18. A structure for installing a flexible printed circuit board for allowing a flexible printed circuit board to be installed on a lens barrel having an n (n≧3) number of members moving relative to and parallel with each other, said structure comprising:
means for providing an n number of fixing points by fixing said flexible printed circuit board at one point of each of said members;

means for forming a U-turn portion between said fixing points, said U-turn portion moving in response to the movement of each of said members; and means for determining the positions of said U-turn portions such that at least two of said U-turn portions are assembled together at a substantially identical position at a particular timing of the relatively moving strokes of said members.

19. A structure according to claim 18, wherein said members include a fixed barrel, a first movable barrel moving only in the direction of an optical axis, and a second movable barrel moving only in the direction of said optical axis, said flexible printed circuit board is secured directly or via another member to said fixed barrel, said first movable barrel, and said second movable barrel so as to form two U-turn portions, and said two U-turn portions are assembled in such a manner as to be superposed on each other in a particular state in which said first movable barrel and said second movable barrel is brought into proximity with said fixed barrel.

20. A structure according to claim 19, further comprising a movable electrical device connected to one end of said flexible printed circuit board.

21. A structure according to claim 19, further comprising a movable electrical device connected to one end of said flexible printed circuit board and a fixed electrical device connected to the other end thereof.

22. A structure according to claim 21, wherein an actuator is used as said movable electrical device, while another circuit board is used as said fixed electrical device.

* * * * *

UNITED STATES PATENT AND TRADEMARK OFFICE
CERTIFICATE OF CORRECTION

PATENT NO. : 4,864,348

DATED : September 5, 1989

INVENTOR(S) : Yutaka Fujiwara, et al.

It is certified that error appears in the above-identified patent and that said Letters Patent is hereby corrected as shown below:

COLUMN 2:

Line 10, "an" should read --a--.

Line 27, "adopted; FIG. 7" should read --adopted;
         FIG. 7-- (The phrase "FIG. 7" is a new paragraph).

COLUMN 7:

Line 4, "or" should read --of--.

Line 61, "shape shape" should read --shape--.

COLUMN 9:

Line 22, "FPC board 201. FIG. 16" should read --FPC board 201.
         FIG. 16-- (The phrase FIG. 16 is a new paragraph).

Line 32, "board" should read --board 201--.

UNITED STATES PATENT AND TRADEMARK OFFICE
CERTIFICATE OF CORRECTION

PATENT NO. : 4,864,348
DATED : September 5, 1989
INVENTOR(S) : Yutaka Fujiwara, et al.

It is certified that error appears in the above-identified patent and that said Letters Patent is hereby corrected as shown below:

COLUMN 12:

Line 26, "are" should read --are cases--.

COLUMN 16:

Line 4, "is" should read --are--.

Signed and Sealed this

Twenty-sixth Day of March, 1991

Attest:

HARRY F. MANBECK, JR.

Attesting Officer

Commissioner of Patents and Trademarks